United States Patent [19]

Urakawa et al.

[11] Patent Number: 4,992,681
[45] Date of Patent: Feb. 12, 1991

[54] LOGIC LEVEL CONVERTING CIRCUIT

[75] Inventors: Yukihiro Urakawa, Kanagawa; Masataka Matsui, Tokyo, both of Japan

[73] Assignee: Kabushiki Kaisha Toshiba, Kanagawa, Japan

[21] Appl. No.: 451,316

[22] Filed: Dec. 15, 1989

[30] Foreign Application Priority Data

Dec. 28, 1988 [JP] Japan .................... 63-333577

[51] Int. Cl.⁵ .............. H03K 19/094; H03K 19/20; H03K 19/0175; H03L 5/00
[52] U.S. Cl. ............................ 307/475; 307/451; 307/264
[58] Field of Search ............... 307/475, 443, 451, 264

[56] References Cited

U.S. PATENT DOCUMENTS

| | | | |
|---|---|---|---|
| 4,695,744 | 9/1987 | Giordano | 307/264 |
| 4,697,109 | 9/1987 | Honma et al. | 307/475 |
| 4,740,718 | 4/1988 | Matsui . | |
| 4,813,022 | 3/1989 | Matsui et al. . | |
| 4,815,040 | 3/1989 | Matsui et al. . | |
| 4,845,381 | 7/1989 | Cuevas | 307/451 |

OTHER PUBLICATIONS

A 13ns/500 mW 64Kb ECL RAM, Katsumi Ogiue et al., ISSC Digest of Technical Papers, pp. 212–213, 1986.

Primary Examiner—Stanley D. Miller
Assistant Examiner—Yen Nguyen
Attorney, Agent, or Firm—Finnegan, Henderson, Farabow, Garrett, and Dunner

[57] ABSTRACT

A logic level converting circuit for converting an ECL level signal to a CMOS level signal comprises complementary signal generating means and level shifting means. The complementary signal generating means generates complementary signals in response to the ECL level input signal and a first reference voltage. The level shifting means operates as a flip-flop circuit, and includes a first and a second PMOS transistors which are either conductive or not conductive in response to the relationship between the complementary signals and a second reference voltage applied to the gate electrodes of the PMOS transistors.

8 Claims, 3 Drawing Sheets

LOGIC LEVEL CONVERTING CIRCUIT

BACKGROUND OF THE INVENTION

1. Field of the Invention

This invention concerns a logic level converting circuit for converting a ECL level signal to a CMOS level signal. More particularly, this invention concerns a logic level converting circuit fabricated using bipolar transistors and complementary MOS (CMOS) circuits.

2. Description of the Prior Art

Recently, a Bi-CMOS circuit, which is composed of bipolar transistors and CMOS circuits, has been widely used for making use of the characteristics of the high speed operation of the ECL circuit and the low power consumption of the CMOS circuits. However, a logic level converting circuit for converting the ECL level (e.g., −0.9 volt to −1.7 volt) signal to a CMOS level (e.g. 0 to −5.2 volt) signal is required.

FIG. 1 is a block diagram of a conventional logic level converting circuit using the Bi-CMOS technology. Namely, the logic level converting circuit includes a receiving circuit section RC, a differential amplifier section DA, an emitter follower circuit section EF and a level shifting section LS.

FIG. 2 is a circuit diagram of the conventional logic level converting circuit. Namely, the receiving circuit section RC includes a bipolar transistor Q1 having a base electrode supplied with a ECL level input signal A, a collector electrode supplied with a power source voltage VCC (e.g., 0 volt) and an emitter electrode connected to the anode of a diode DI. The cathode of the diode DI is connected to a second power source voltage VEE (e.g., −5.2 volt) through a constant current source I1.

The differential amplifier section DA includes differential pair transistors Q2 and Q3. The base electrode of the transistor Q2 is connected to the cathode of the diode DI, and the collector electrode thereof is supplied with the power source voltage VCC through a resistor R1. The base electrode of the transistor Q3 is supplied with a reference voltage V1, and the collector electrode thereof is supplied with the power source voltage VCC through a second resistor R2. The emitter electrodes of the transistors Q2 and Q3 are connected in common and are connected to a constant current source I2. The input signal B to the base electrode of the transistor Q2 is compared with the reference voltage V1, and complementary signals C and $\overline{C}$ are output from the collector electrodes of the transistors Q2 and Q3, respectively.

The emitter follower circuit section EF includes bipolar transistors Q4 and Q5. The base electrodes of the transistors Q4 and Q5 are connected to the collector electrodes of the transistors Q2 and Q3, and the collector electrodes thereof are supplied with the power source voltage VCC. The emitter electrodes of the transistors Q4 and Q5 are connected to constant current sources I3 and I4, respectively. The complementary signals C and $\overline{C}$ are level shifted by the transistors Q4 and Q5, and level shifted complementary signals D and $\overline{D}$ are obtained at the emitter electrodes of the transistors Q4 and Q5.

The level shifting means LS includes two pairs of P-channel MOS (PMOS) transistors P10, P11 and P12, P13. The gate electrodes of the PMOS transistors P11 and P12 are supplied with one of the level shifted complementary signal D, and the gate electrodes of the transistors P10 and P13 are supplied with the remaining signal $\overline{D}$. The source electrodes of the PMOS transistors P10, P11, P12 and P13 are supplied with the power source voltage VCC, and the drain electrodes thereof are connected to current mirror circuits M1 and M2.

The current mirror circuit M1 includes N-channel MOS (NMOS) transistors N10 and N11. The source electrodes of the NMOS transistors N10 and N11 are supplied with the power source voltage VEE, and the gate electrodes thereof are connected in common. The drain electrode and the gate electrode of the NMOS transistor N10 are connected to the drain electrode of the PMOS transistor P10. Similarly, the current mirror circuit M2 includes two NMOS transistors N12 and N13. The source electrodes of the NMOS transistors N12 and N13 are supplied with the power source voltage VEE, and the gate electrodes thereof are connected in common. The drain electrode and the gate electrode of the transistor N12 are connected to the drain electrode of the transistor P12, and the drain electrode of the transistor N13 is connected to the drain electrode of the transistor N13 is connected to the drain electrode of the transistor P13.

In this conventional circuit, complementary output signals E and $\overline{E}$ of the CMOS level can be obtained from the drain electrodes of the transistors P11 and P13. However, in this conventional circuit, two current mirror circuits M1 and M2 are used in the level shifting section LS. Thus, at least one direct current path may be formed between the power sources VCC and VEE in accordance with the complementary signals D and $\overline{D}$, and power consumption may be increased. Thus, the advantage of low power consumption provided by utilizing the CMOS circuits may be lost.

Furthermore, the on/off switching of the PMOS transistors P10, P11, P12 and P13 is accomplished by the relationship between the power source voltage VCC and the complementary signals D and $\overline{D}$. Thus, due to the fluctuation of the threshold voltages of the PMOS transistors, the PMOS transistors are sometimes insufficiently turned off, and the output signal E and $\overline{E}$ do not reach the VEE level. Therefore, a through current sometimes flows in a following CMOS circuit (not shown). Thus, the merit of the low power consumption due to the CMOS circuits may be further deteriorated.

SUMMARY OF THE INVENTION

Therefore, an object of the present invention is to provide a logic level converting circuit which has low power consumption.

Another object of the present invention is to provide a stabilized logic level converting circuit in spite of the fluctuation of the threshold voltages of the MOS transistors utilized.

To achieve the objects, this invention provides a logic level converting circuit for converting a ECL level input signal to a CMOS level output signal, responsive to a first and a second power source voltages comprising: complementary signal generating means for generating complementary signals in response to the ECL level input signal and a first reference voltage; level shifting means for outputting complementary output signals of CMOS level, and said level shifting means including a first MOS transistor of a first conductivity type having a source electrode supplied with one of said complementary signals, a gate electrode supplied with a second reference voltage and a drain electrode, a second MOS transistor of the first conductivity type having a source electrode supplied with the other of said complementary signals, a gate electrode supplied with said second reference voltage and a drain electrode, a third MOS transistor of a second conductivity type having a source electrode supplied with said second power source voltage and a gate electrode connected to the drain electrode of the second MOS transistor and a drain electrode connected to the drain electrode of the first MOS transistor, a fourth MOS transistor of the second conductivity type having a source electrode supplied with said second power source voltage, a gate electrode connected to the drain electrode of the first MOS transistor and a drain electrode connected to the drain electrode of the second MOS transistor, whereby the drain electrodes of the first and the second MOS transistors form the outputs of the logic level converting circuit.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings.

DETAILED DESCRIPTION OF THE INVENTION

Figure 1:
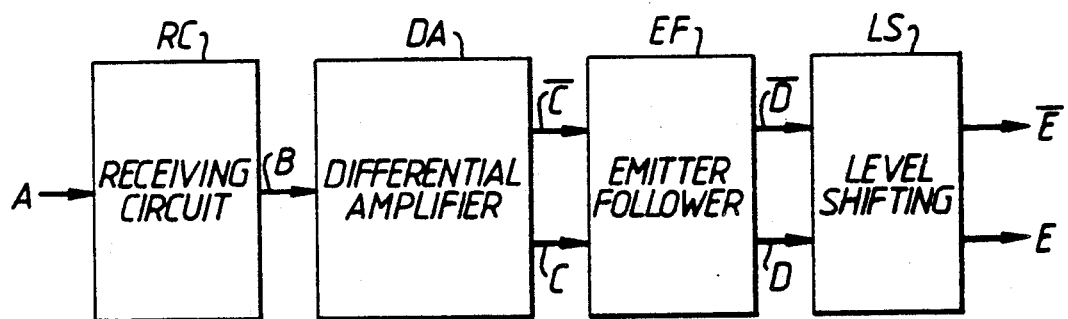
FIG. 1 is a block diagram of a conventional logic level converting circuit.
Figure 2:
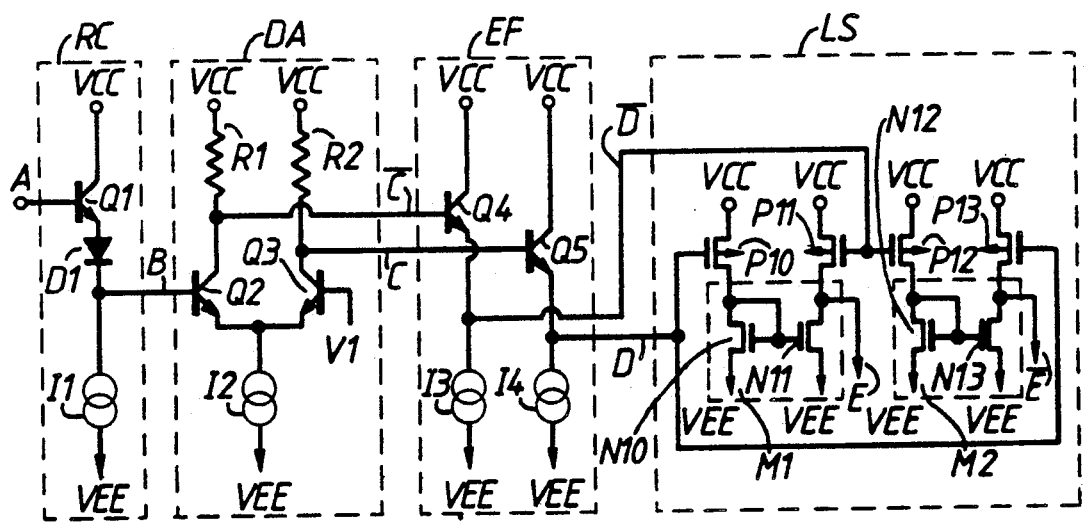
FIG. 2 is a circuit diagram of a conventional logic level converting circuit.
Figure 3:
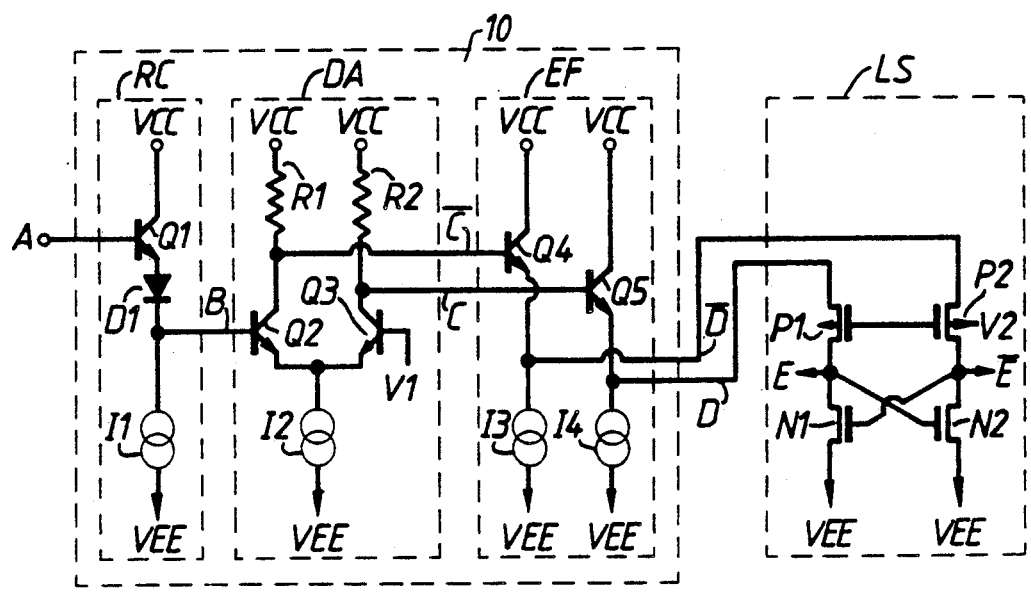
FIG. 3 is a circuit diagram of a preferred embodiment of the present invention.

Referring now to FIG. 3, a preferred embodiment according to the present invention will be explained. In FIG. 3, an input signal A of ECL level (e.g., $-0.9$ volt to $-1.7$ volt) is supplied to an input terminal A.

In this invention, there is provided complementary signal generating means for generating complementary signals in response to the ECL level input signal. In the preferred embodiment of FIG. 3, a complementary generating means 10 includes a receiving circuit section RC, a differential amplifier circuit section DA and an emitter follower circuit section EF.

The receiving circuit section RC includes a bipolar transistor Q1. The base electrode of the transistor Q1 is supplied with the input signal A, and the collector electrode thereof is supplied with a power source voltage VCC, e.g., 0 volt. The emitter electrode of the transistor Q1 is connected to an anode of a diode DI. The cathode of the diode DI is connected to a power source voltage VEE, e.g., $-5.2$ volt, through a first current source I1.

The differential amplifier section DA includes a differential pair transistors Q2 and Q3. The base electrode of the transistor Q2 is connected to the cathode of the diode DI, and the collector electrode thereof is supplied with the power source voltage VCC through a first resistor R1. The base electrode of the transistor Q3 is supplied with a first reference voltage V1, and the collector electrode thereof is supplied with the power source voltage VCC through a second resistor R2. The emitter electrodes of the transistors Q2 and Q3 are connected in common, and are connected to the power source voltage VEE through a second current source I2.

The first reference voltage V1 is set to an intermediate voltage between (VH-2.Vf) and (VL-2.Vf), where VH is the high level of the ECL level, VL is the low level of the ECL level, and Vf is a base-emitter voltage of the transistor Q1 and the forward bias voltage of the diode DI. In the case where the diode DI in the receiving circuit section RC is omitted, the V1 is set to an intermediate voltage between (VH−Vf) and (VL−Vf).

The emitter follower circuit section EF includes two bipolar transistors Q4 and Q5. The base electrode of the transistor Q4 is connected to the collector electrode of the transistor Q2, and the base electrode of the transistor Q5 is connected to the collector electrode of the transistor Q3. The collector electrodes of the transistors Q4 and Q5 are supplied with the power source voltage VCC, and the emitter electrodes thereof are connected to the power source voltage VEE through a third and a fourth current sources I3 and I4, respectively.

In this invention, there is provided level shifting means for outputting complementary output signals of CMOS logic level. In the preferred embodiment of FIG. 3, a level shifting means LS includes a first and a second PMOS transistors P1 and P2. The source electrode of the PMOS transistor P1 is connected to the emitter electrode of the bipolar transistor Q5, and the source electrode of the PMOS transistor P2 is connected to the emitter electrode of the bipolar transistor Q4. The gate electrodes of the PMOS transistors P1 and P2 are connected in common, and are supplied with a second reference voltage V2.

The level shifting means LS further comprises a third and a fourth NMOS transistors N1 and N2. The source electrodes of the NMOS transistors N1 and N2 are supplied with the power source voltage VEE, and the drain electrodes thereof are connected to the drain electrodes of the PMOS transistors P1 and P2, respectively. The gate electrode of the PMOS transistor N1 is connected to the drain electrode of the PMOS transistor P2, and the gate electrode of the NMOS transistor N2 is connected to the drain electrode of the PMOS transistor P1.

The second reference voltage V2 is set to an intermediate voltage between $(-Vf-|VTP|)$ and $(-3Vf-|VTP|)$, where VTP is the threshold voltage of the PMOS transistors P1 and P2.

The operation of the above circuit will now be explained. The input signal A of the ECL level signal is level shifted by the bipolar transistor Q1 and the diode DI in the receiving circuit section RC by 2.Vf, and is converted to the signal B. The signal B is compared with the first reference voltage V1 in the differential amplifier section DA. In the case where the signal B is higher than the reference voltage V1, the transistor Q2 becomes conductive and the signal C becomes logical "0" level. For example, the gain of the differential amplifier section DA is chosen to produce complementary signals C and $\overline{C}$ which have 0 volt and $-2Vf$ volt as logical "1" and logical "0" level, for example.

The complementary signals C and $\overline{C}$ are supplied to the emitter follower circuit section EF. In the emitter follower circuit section EF, the complementary signals C and $\overline{C}$ are converted to level shifted complementary signals D and $\overline{D}$ which are level shifted by Vf by the bipolar transistors Q4 and Q5. Thus, the logical "1" of the complementary signal D is equal to $-Vf$, and the logical "0" thereof is equal to $-3Vf$.

Thus, by setting the second reference voltage V2 to an intermediate voltage between $(-Vf-|VTP|)$ and $-3.Vf-|VTP|)$, one of the PMOS transistors P1 and P2, which is supplied with the logical "1" signal switches into the conductive state, and the other PMOS transistor supplied with the logical "0" signal switches into the non-conductive state. Namely, in the case where the signal D is at the logical "1", the PMOS transistor P1 becomes conductive, and the P2 becomes non-conductive. Therefore, the voltage level at the drain electrode of the transistor P1 is raised and that of the transistor P2 is lowered. Thus, the gate potential of the NMOS transistor N2 is raised accordingly, and the NMOS N2 becomes conductive. Thus, the drain potential of the PMOS transistor P2 is lowered, and the gate potential of the NMOS transistor N1 is accordingly lowered. Thus, the conductivity of the NMOS transistor N1 is lowered, and the drain potential of the transistor P1 is further raised. Finally, the drain potential of the PMOS transistor P1 is raised to $-Vf$, and the drain potential of the PMOS transistor P2 is lowered to VEE. Thus, complementary CMOS level signals E and $\overline{E}$ are achieved. In this condition, the PMOS transistor P1 and the NMOS transistor N2 are on, and the PMOS transistor P2 and the NMOS transistor N1 are off. Thus, the logic level converting section LS acts as a flip-flop circuit, and the formation of direct current path is prevented. Thus, a reduction in the power consumption is achieved.

Furthermore, the on/off switching of the PMOS transistors P1 and P2 is accomplished according to the relationship between the second reference voltage V2 and the complementary signals D and $\overline{D}$. Thus, by adjusting the second reference potential level V2 in accordance with the fluctuation of the threshold voltage of the PMOS transistors P1 and P2, it is possible to insure one of the PMOS transistors P1 and P2 is in on the state and the other is in the off state. Therefore, the output signals E and $\overline{E}$ can be lowered to VEE, and it is possible to prevent a through current between the power sources in a following CMOS circuit (not shown). In this way, the controllability of the on/off of the PMOS transistors P1 and P2 is improved, and the stabilization of the circuit is achieved.

Moreover, since no direct current path is formed in the level shifting means LS, it is possible to make the dimensions of the transistors P1, P2, N1 and N2 larger compared to those of the conventional circuit. Thus, the driving capacity can be increased, and the operation can be speeded-up.

Figure 4:
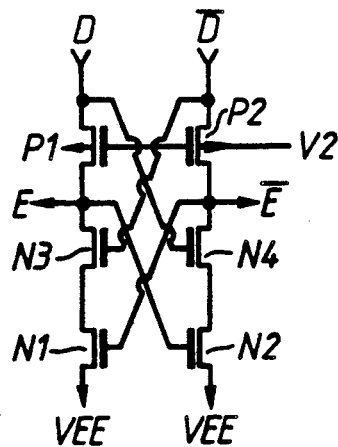
FIG. 4 is a circuit diagram of a modified form of the level shifting means in FIG. 3.

FIG. 4 is a circuit diagram of a modified form of the level shifting means LS in FIG. 3. In this level shifting means, an NMOS transistor N3 is serially connected between the PMOS transistor P1 and the NMOS transistor N1, and an NMOS transistor N4 is serially connected between the PMOS transistor P2 and the NMOS transistor N2. Namely, the drain electrode of the NMOS transistor N3 is connected to the drain electrode of the PMOS transistor P1, and the source electrode thereof is connected to the drain electrode of the NMOS transistor N1. The gate electrode of the NMOS transistor N3 is connected to the source electrode of the PMOS transistor P2.

The drain electrode of the NMOS transistor N4 is connected to the drain electrode of the PMOS transistor P2, and the source electrode thereof is connected to the drain electrode of the NMOS transistor N2. The gate electrode of the NMOS transistor N4 is connected to the source electrode of the PMOS transistor P1.

The operation of this circuit is substantially the same to that of the level shifting means LS in FIG. 3. However, the switching speed may be increased compared with FIG. 3, due to the NMOS transistors N3 and N4. Namely, since the gate electrodes of the transistors N3 and N4 are supplied with the input signals D and $\overline{D}$ to the level shifting means LS, the conductivity of the NMOS transistor N3 and N4, and therefore the drain potentials of the PMOS transistors P1 and P2, are directly controlled by the input signals D and $\overline{D}$. Therefore, the switching speed can be increased.

Figure 5:
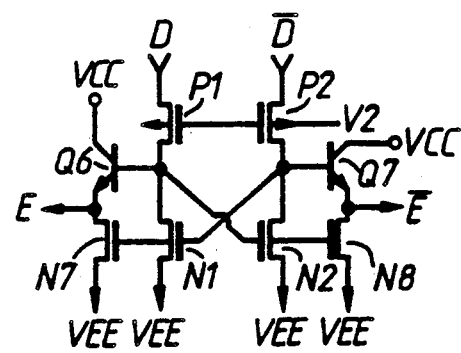
FIG. 5 is a circuit diagram of another modified form of the level shifting means in FIG. 3.

FIG. 5 is a circuit diagram of another modified form of the level shifting means LS in FIG. 3. In this circuit, two NMOS transistors N7 and N8 and two bipolar transistors Q6 and Q7 are further included compared with that of FIG. 3. Namely, the gate electrode of the NMOS transistor N7 is connected to the gate electrode of the NMOS transistor N1, and the source electrode thereof is supplied with the power source voltage VEE. The gate electrode of the NMOS transistor N8 is connected to the gate electrode of the NMOS transistor N2, and the source electrode thereof is supplied with the power source voltage VEE. The base electrode of the bipolar transistor Q6 is connected to the drain electrode of the PMOS transistor P1, and the emitter electrode thereof is connected to the drain electrode of the NMOS transistor N7. The base electrode of the transistor Q7 is connected to the drain electrode of the PMOS transistor P2, and the emitter electrode thereof is connected to the drain electrode of the NMOS transistor N8. The collector electrodes of the bipolar transistors Q6 and Q7 are supplied with the power source voltage VCC.

In this circuit, when the drain potential of the PMOS transistor P1 is raised, the bipolar transistor Q6 switches to the conductive state. Due to the large driving capacity of the bipolar transistor Q6, the output signal E is rapidly pulled-up. Since the drain potential of the PMOS transistor P1 is high level, the NMOS transistor N8 becomes conductive and pulls down the output signal $\overline{E}$ to VEE level.

In this circuit, it is possible to make the dimensions of the NMOS transistors N7 and N8 sufficiently large, since the parasitic capacitances due to the NMOS transistors N7 and N8 at the drain electrodes of the PMOS transistors P1 and P2 can be reduced due to the bipolar transistors Q6 and Q7. Thus, it is possible to increase the driving capacity of the NMOS transistors N7 and N8 to get a high speed pull-down operation. Therefore, the switching speed can be speeded-up.

Figure 6:
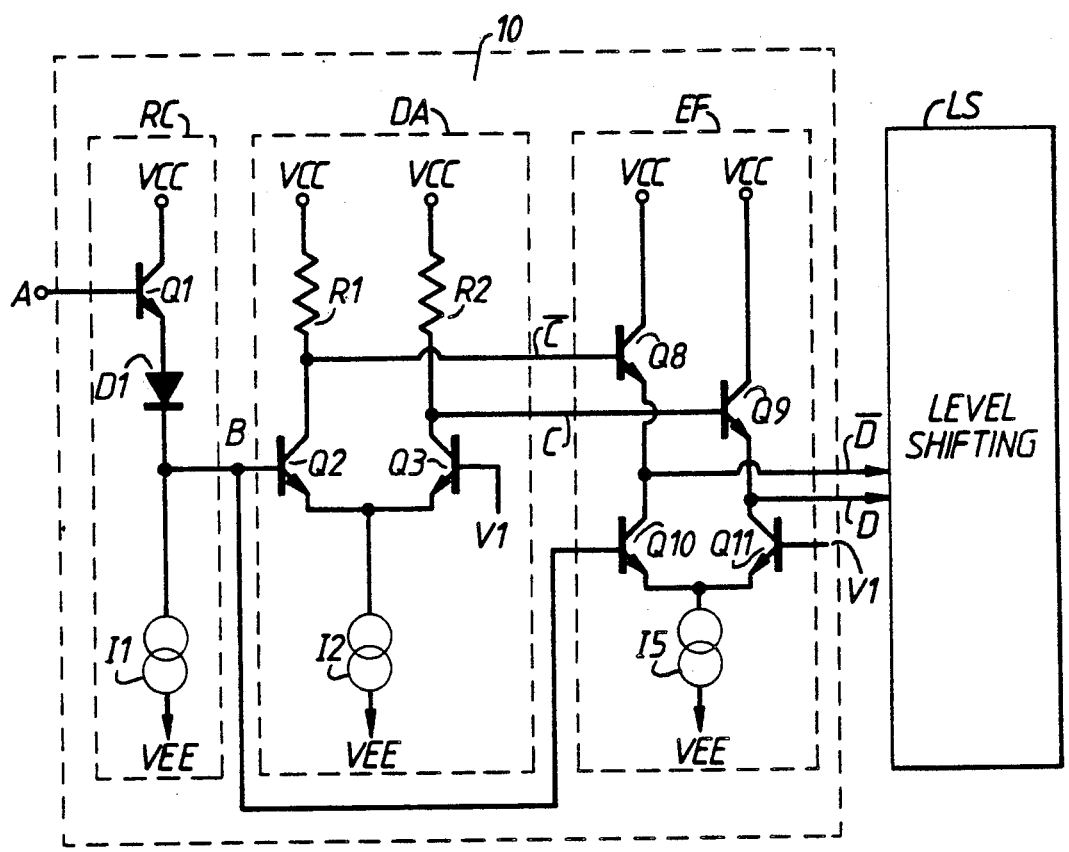
FIG. 6 illustrates a modified form of emitter follower circuit section according to the present invention.

FIG. 6 illustrates a modified form of emitter follower circuit section EF according to the present invention. In this embodiment, the emitter follower section EF in the complementary signal generating means 10 includes bipolar transistors Q8, Q9, Q10 and Q11 and a current source I5. Namely, the base electrodes of the bipolar transistors Q8 and Q9 are connected to the collector electrodes of the differential pair transistors Q2 and Q3 in the differential amplifier section DA. The collector electrodes of the transistors Q8 and Q9 are supplied with the power source voltage VCC. The base electrode of the transistor Q10 is connected to the base electrode of the transistor Q2 and receives the level sifted input signal B. The base electrode of the transistor Q11 is supplied with the first reference voltage V1. The collector electrodes of the transistors Q10 and Q11 are connected to the emitter electrodes of the transistors Q8 and Q9, and the complementary signals D and D are obtained from the collector electrodes of the transistors Q8 and Q9. The emitter electrodes of the transistors Q10 and Q11 are connected to the current source I5.

In this circuit, the current source I5 is switched according to the relationship between the first reference voltage V1 and the level shifted input signal B. Namely, when the level sifted input signal B is higher than the reference voltage V1, the transistor Q10 becomes conductive and the current of the current source I5 is switched to the transistor Q10. Since the current source is required only for pulling down one of the complementary signals D and D, the emitter follower section EF can be fabricated using only one current source I5 by switching the current thereof. As the result, the power consumption can be reduced.

The present invention has been described with respect to certain specific embodiments. However, other embodiments based on the principles of the present invention should be obvious to those of ordinary skill in the art. Such embodiments are intended to be covered by the claims.

What is claimed is:

1. A logic level converting circuit for converting a ECL level input signal to a CMOS level output signal, responsive to a first and a second power source voltages comprising:

complementary signal generating means for generating complementary signals in response to the ECL level input signal and a first reference voltage;

level shifting means for outputting complementary output signals of CMOS level, and said level shifting means including a first MOS transistor of a first conductivity type having a source electrode supplied with one of said complementary signals, a gate electrode supplied with a second reference voltage and a drain electrode, a second MOS transistor of the first conductivity type having a source electrode supplied with the other of said complementary signals, a gate electrode supplied with said second reference voltage and a drain electrode, a third MOS transistor of a second conductivity type having a source electrode supplied with said second power source voltage and a gate electrode connected to the drain electrode of the second MOS transistor and a drain electrode connected to the drain electrode of the first MOS transistor, a fourth MOS transistor of the second conductivity type having a source electrode supplied with said second power source voltage, a gate electrode connected to the drain electrode of the first MOS transistor and a drain electrode connected to the drain electrode of the second MOS transistor, whereby the drain electrodes of the first and the second MOS transistors form the outputs of the logic level converting circuit.

2. The logic level converting circuit according to claim 1, wherein the level shifting means further comprises, a fifth MOS transistor of the second conductivity type serially connected between the first and the third MOS transistors, having a source electrode connected to the drain electrode of the third MOS transistor and a gate electrode connected to the source electrode of the second MOS transistor and a drain electrode connected to the drain electrode of the first MOS transistor, and a sixth MOS transistor of the second conductivity type serially connected between the second and the fourth MOS transistors, having a source electrode connected to the drain electrode of the fourth MOS transistor, a gate electrode connected to the source electrode of the first MOS transistor and a drain electrode connected to the drain electrode of the second MOS transistor.

3. The logic level converting circuit according to claim 1, wherein the level shifting means further comprises, a seventh MOS transistor of the second conductivity type having a source electrode supplied with said second power source voltage, a gate electrode connected to the gate electrode of the third MOS transistor and a drain electrode, a eighth MOS transistor of the second conductivity type having a source electrode supplied with said second power source voltage, a gate electrode connected to the gate electrode of the fourth MOS transistor, and a drain electrode, a first bipolar transistor having a base electrode connected to the drain electrode of the first MOS transistor, an emitter electrode connected to the drain electrode of the seventh MOS transistor and a collector electrode supplied with the first power source voltage, and a second bipolar transistor having a base electrode connected to the drain electrode of the second MOS transistor, an emitter electrode connected to the drain electrode of the eighth MOS transistor and a collector electrode supplied with the first power source voltage.

4. The logic level converting circuit according to claim 1, wherein the complementary signal generating means includes;

receiving means for receiving the ECL level input signal and outputting a level shifted signal, a differential amplifier section for outputting complementary signals by comparing the level shifted signal with the first reference voltage, and an emitter follower circuit section for outputting level shifted complementary signals in response to the complementary signals.

5. The logic level converting circuit according to claim 4, wherein the receiving circuit section includes a third bipolar transistor having a base electrode supplied with the ECL level input signal, a collector electrode supplied with the first power source voltage and an emitter electrode connected to a first current source, the differential amplifier section includes, a fourth and a fifth bipolar transistors type each having a base electrode, an emitter electrode and a collector electrode, with the base electrode of the fourth bipolar transistor connected to the emitter electrode of the third bipolar transistor, the collector electrode of the fourth bipolar transistor supplied with the first power source voltage through a first resistor, the base electrode of the fifth bipolar transistor is supplied with the first reference voltage, the collector electrode of the fifth bipolar transistor supplied with the first power source voltage through a second resistor, the emitter electrodes of the fourth and the fifth bipolar transistors connected to a second constant current source, and the emitter follower circuit section includes, a sixth bipolar transistor having a base electrode connected to the collector electrode of the fourth bipolar transistor, a collector electrode supplied with the first power source voltage and an emitter electrode, a seventh bipolar transistor having a base electrode connected to the collector electrode of the fifth bipolar transistor, a collector electrode supplied with the first power source voltage and an emitter electrode, a eighth bipolar transistor having a base electrode supplied with the level shifted input signal, a collector electrode connected to the emitter electrode of the sixth bipolar transistor and an emitter electrode connected to a third current source, a ninth bipolar transistor having a base electrode supplied with the first reference voltage, a collector electrode connected to the emitter electrode of the seventh bipolar transistor and an emitter electrode connected to the third current source.

6. A level shifted complementary signal generating circuit, comprising:

complementary signal generating means for generating a first and a second signals alternating between a first and a second voltage levels;

a first MOS transistor of a first conductivity type having a source electrode supplied with one of the complementary signals, a gate electrode supplied with a reference voltage having a predetermined voltage between the first and the second voltage levels and a drain electrode;

a second MOS transistor of the first conductivity type having a source electrode supplied with the other of the complementary signals, a gate electrode supplied with the reference voltage and a drain electrode;

a third MOS transistor of a second conductivity type having a source electrode supplied with a first power source voltage, a gate electrode connected to the drain electrode of the second MOS transistor and a drain electrode connected to the drain electrode of the first MOS transistor; and a fourth MOS transistor of the second conductivity type having a source electrode supplied with the first power source voltage, a gate electrode connected to the drain electrode of the first MOS transistor and a drain electrode connected to the drain electrode of the second MOS transistor.

7. The level shifted complementary signal generating circuit according to claim 6, further comprising:

a fifth MOS transistor of the second conductivity type serially connected between the first and the third MOS transistors, having a source electrode connected to the drain electrode of the third transistor and a gate electrode connected to the source electrode of the second transistor and a drain electrode connected to the drain electrode of the first MOS transistor, and a sixth MOS transistor of the second conductivity type serially connected between the second and the fourth MOS transistors, having a source electrode connected to the drain electrode of the fourth MOS transistor, a gate electrode connected to the source electrode of the first MOS transistor and a drain electrode connected to the drain electrode of the second MOS transistor.

8. The level shifted complementary signal generating circuit according to claim 6, further comprising:

a seventh MOS transistor of the second conductivity type having a source electrode supplied with the first power source voltage, a gate electrode connected to the gate electrode of the third MOS transistor and a drain electrode, a eighth MOS transistor of the second conductivity type having a source electrode supplied with the first power source voltage, a gate electrode connected to the gate electrode of the fourth MOS transistor, and a drain electrode, a first bipolar transistor, having a base electrode connected to the drain electrode of the first MOS transistor, an emitter electrode connected to the drain electrode of the seventh MOS transistor and a collector electrode supplied with a second power source voltage, and a second bipolar transistor having a base electrode connected to the drain electrode of the second MOS transistor, an emitter electrode connected to the drain electrode of the eighth MOS transistor and a collector electrode supplied with the second power source voltage.

* * * * *